United States Patent [19]

Sirtl et al.

[11] 3,900,943

[45] Aug. 26, 1975

[54] SILICON SEMICONDUCTOR DEVICE ARRAY AND METHOD OF MAKING SAME

[75] Inventors: Erhard Sirtl, Munich, Germany; Cedric G. Currin, Midland, Mich.

[73] Assignee: Dow Corning Corporation, Midland, Mich.

[22] Filed: June 7, 1973

[21] Appl. No.: 367,913

[52] U.S. Cl. .......................... 29/572; 29/578; 29/576
[51] Int. Cl. .......................... B01j 17/00
[58] Field of Search ............. 29/576, 572, 578, 590; 148/1.5; 136/89; 317/235 AT

[56] References Cited

UNITED STATES PATENTS 3,651,385 3/1972 Kobayashi .................... 317/235 AT
3,725,751 4/1973 Wakamiya .................... 317/235 AT

*Primary Examiner*—Roy Lake
*Assistant Examiner*—W. C. Tupman
*Attorney, Agent, or Firm*—Howard W. Hermann

[57] ABSTRACT

Silicon semiconductor device array, e.g. solar cell device or array of devices; formed from bulk silicon deposited in the form of columnar crystallites bounded by substantially vertical grain boundaries. Junctions are formed across crystallites and along grain boundaries. The grain boundaries are made substantially non-conductive by diffusion from one side of the sheet. $P^+$ and $n^+$ layers are provided as contact areas for electrodes. Deposition of silicon takes place directly from decomposition of silicon-containing vapors onto a non-silicon substrate sheet.

16 Claims, 6 Drawing Figures

4A 4B 4C 4D 4E 4F

SILICON SEMICONDUCTOR DEVICE ARRAY AND METHOD OF MAKING SAME

BACKGROUND OF THE INVENTION

The present invention relates to large area semiconductor devices and to flat arrays of semiconductor devices such as solar cells and to methods of manufacturing such devices and arrays from silicon.

In general, semiconductor devices such as rectifiers, solar cells, transistors and the like are formed by junctions between semiconductor layers of different conductivity types. Such devices when made of silicion are generally manufactured by starting with a monocrystalline wafer of silicon sliced from a rod which was doped while it was being grown to make it either n-type or p-type. One face of the wafer or a portion thereof is then converted to the opposite conductivity type resulting in a p-n junction. The conversion from one conductivity type to the other in the wafer is accomplished by introducing a dopant element of the desired type either by diffusion, ion implantation or by growing a doped epitaxial layer on the wafer surface. Electrical interconnections, insulation and additional junctions are added by a variety of techniques well known to those skilled in the art.

In the production of large area arrays such as power rectifiers or solar cells, several disadvantages are inherent in prior art techniques. Particularly for solar cells, where extremely large areas are desired for converting solar energy to electrical energy, the cost of such devices is prohibitive unless no other energy source is available. First, a high purity polycrystalline silicon rod must be grown. The rod must then be converted to monocrystalline material by float zoning or the Czochralski process. The rod must then be sawed into wafers which must be lapped, cleaned and polished. Waste occurs in all of these steps before formation of an active semiconductor device having p-n junctions can begin. Even then the single array size is limited by diameter of the semiconductor rod that is sliced to form the wafer.

For some time, therefore, thought has been given to developing cheaper methods of producing solar cells. One approach which has been tried but found to result in an extremely inefficient unit is the use of bulk polycrystalline material. Grain boundaries between crystallites in such materials prevent proper transfer of charges in the material. Dopants tend to follow grain boundaries when diffused into the material. Accordingly unoriented p-n junctions appear around grains effectively isolating charges. Further, heavy metal impurities tend to concentrate in the grain boundaries and along with discontinuities in the grain boundaries contribute to recombining of electron-hole pairs resulting in no electrical output from the system. Accordingly, this approach has not been accepted.

Summary of Present Invention

Accordingly, it is an object of the present invention to provide an economical method of producing large area silicon semiconductor device arrays. A further object is to produce such an array without the necessity of first growing polycrystalline silicon, converting it to single crystal rods and then slicing, lapping, and polishing before device fabrication as such can begin.

The present invention is based on the discovery that when polycrystalline silicon is deposited on a smooth, flat substrate in relatively fine grain form, after several microns of disoriented growth a natural selection process takes place resulting in subsequent growth in the form of columnar crystallites in the <110> growth direction separation by 111 grain or twin boundaries developed generally perpendicular to the surface. The crystallites are each monocrystalline in nature and continue growing in height as deposition continues. Each crystallite therefore has the potential to be made into an active semiconductor device by doping with impurities to form one or more p-n junctions therein. Inasmuch as dopant diffusion tends to follow grain boundaries faster than diffusion in the bulk material, electrical isolation between crystallites can be achieved as desired. For solar cell arrays heavy doping from both sides to create a $p^+$ layer on one side and an $n^+$ layer on the other effectively act as contacts for the n-type and p-type areas adjacent the junctions. The combination of planar junctions across each crystallite combined with vertical junctions extending substantially vertically part way down the grain boundaries provides the opportunity for any electron-hole pair formed by a striking photon to find a nearby p-n junction. Electrodes and reflective and/or protective coatings can be applied by prior art techniques.

The array thus formed is much more economically produced than prior devices requiring large areas of silicon and can be made without the problems inherent in bulk polycrystalline silicon solar cells which have heretofore been manufactured.

BRIEF DESCRIPTION OF THE DRAWINGS

Other objects and attendant advantages of the present invention will become obvious to those skilled in the art from a reading of the following detailed description when read in conjunction with the accompanying drawings wherein.

DESCRIPTION OF PREFERRED EMBODIMENTS

Figure 1:
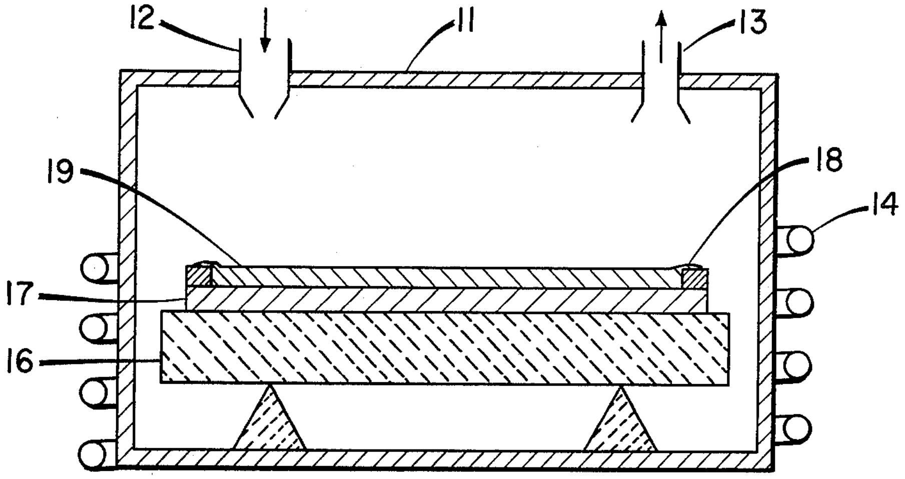
FIG. 1 is a diagrammatic view of a reaction chamber for carrying out the present invention on a laboratory scale.

Referring now to the drawings wherein like reference characters designate like or corresponding parts throughout the figures thereof there is shown in FIG. 1 a reaction chamber 11 having inlet means 12 and outlet means 13 for introduction and exhaust of gases to and from the chamber. The chamber may be made of quartz or molybdenum, for example, but may alternatively be any other material capable of retaining its integrity in contact with gaseous silicon, hydrogen, silicon hydrides and chlorides at temperatures at least as high as 1200°C.

Heating means such as a high frequency electrical coil 14 are disposed in or around the reaction chamber 11. Mounted within the reaction chamber 11 is a susceptor body 16 which may be, for example, graphite. The susceptor element 16 acts to couple with the high frequency heating coils 14 to supply heat to a substrate element 17 positioned on top of the susceptor. Alternatively, electrical resistance hearing or radiant heating can be used.

The substrate sheet 17 should also be a material which is capable of withstanding temperatures above 1200°C. in gaseous atmospheres of hydrogen, silicon, silicon hydrides and chlorides. A preferred substrate is highly polished tantalum in a thickness of approximately 1 mm. However, the thickness is not critical to carrying out the invention except to the extent that thicker substrates tend to modify heat flow and the adherence of silicon to the tantalum varies according to substrate thickness.

Preferably, a mask 18 which may, for example, be made of molybdenum is used to mask the edges of the tantalum substrate 17 to prevent silicion deposition which extends over the edge of the tantalum thereby causing adherence. However, particularly in the case where the tantalum is to remain on the device, made from the silicon being deposited, the mask 18 may be omitted.

According to the present invention silicon is deposited on the substrate 17 by introduction in a hydrogen stream through the inlet 12 of siliconcontaining gases decomposible at temperatures between about 1025°C. and 1200°C. Preferred gases for this purpose include trichlorosilane, dichlorosilane, silicontetrachloride, hexachlorodisilane, and silane, or monosilane as it is sometimes called. While a number of these gases decompose at temperatures below 1025°C. the higher temperatures are preferred for crystallographic reasons in carrying out the present invention. The ratio of silanes to hydrogen in the feed stream should be between 0.5 and 10 mole percent for best results. As is fairly common in silicon deposition processes the feed gases are directed by the inlet 12 into contact with the substrate 17 while it is heated to the proper temperature range resulting in a deposition layer 19 of silicon on the substrate. Spent gases are removed from the chamber through the exhaust or chamber outlet 13.

Figure 3:
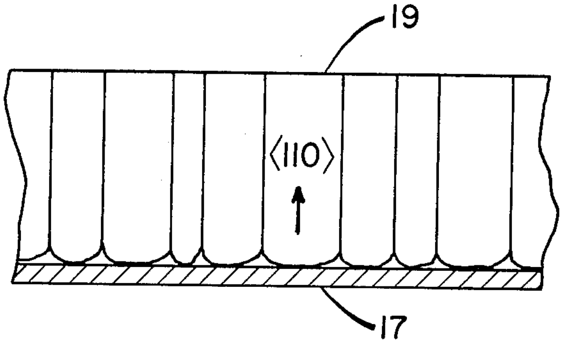
FIG. 3 is a cross-sectional view of a substrate having silicon columnar crystallites deposited thereon in accordance with the present invention.

While the deposition of silicon from the above mentioned raw materials is not usual, it has been found that by proper choice of substrate surface, and conditions within the reactor along with long-term deposition that deposition initially occurs in a relatively unoriented form and then by a natural selection process begins to take the form of columnar or dendritic crystallites growing in the <110> growth direction separated by 111 grain or twin boundaries developed generally perpendicular to the substrate surface. These crystallites are each monocrystalline in nature and continue growing in height as deposition continues. The resulting structure can be seen more clearly from FIG. 3.

Figure 2:
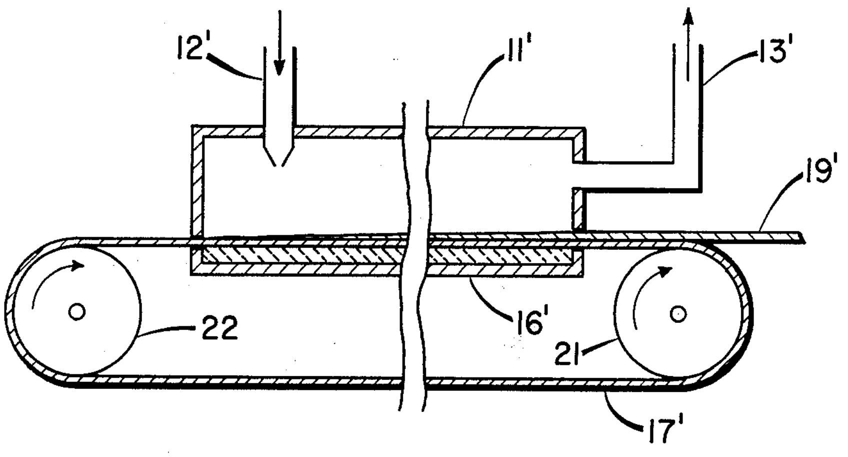
FIG. 2 is a diagrammatic cross-sectional view illustrating a system for carrying out the present invention on a continuous basis.

An alternative embodiment of apparatus for carrying out the present invention is shown in FIG. 2. While the apparatus shown in FIG. 1 is suitable for production on a laboratory scale it is contemplated that the present invention will have broad application for large area devices in which case a more continuous production method is desirable. As shown in FIG. 2 a belt 17′ which may, for example, be tantalum has one reach thereof extending through a reaction chamber 11′ and rotates on a pair of pulleys 21 and 22 which are driven by a suitable power source having speed control means associated therewith. Reactors for deposition on a moving belt are not per se new and accordingly no details of the necessary sealing means, etc. need be shown in this application. Obviously, however, leakage of ambient gases into the reaction chamber and leakage of gases from the reaction chamber to ambient are to be avoided. The reaction chamber 11′ has associated therewith inlet means 12′ and exhaust means 13′ which serve the same purposes as the inlet 12 and exhaust 13 of FIG. 1. Heating means not shown are again necessary for heating a susceptor 16′ on which the belt 17′ slides while in the reaction chamber 11′. It is to be realized that the length of the reaction chamber 11′ and the speed at which the belt 17′ travels through the reaction chamber must be chosen according to the depth of the silicon deposition layer 19′ on the belt 17′. Suitable thicknesses range between about 50 and 500 microns. With these thicknesses and a tantalum belt of about 1 mil thickness separation of the deposit from the belt can be achieved. The differential thermal expansion coefficients between the deposited silicon 19′ and the tantalum 17′ coupled with the bending of the tantalum belt around the pulley 21 at the outlet side of the chamber 11 can provide automatic release of the deposited material from the belt.

Figure 4:
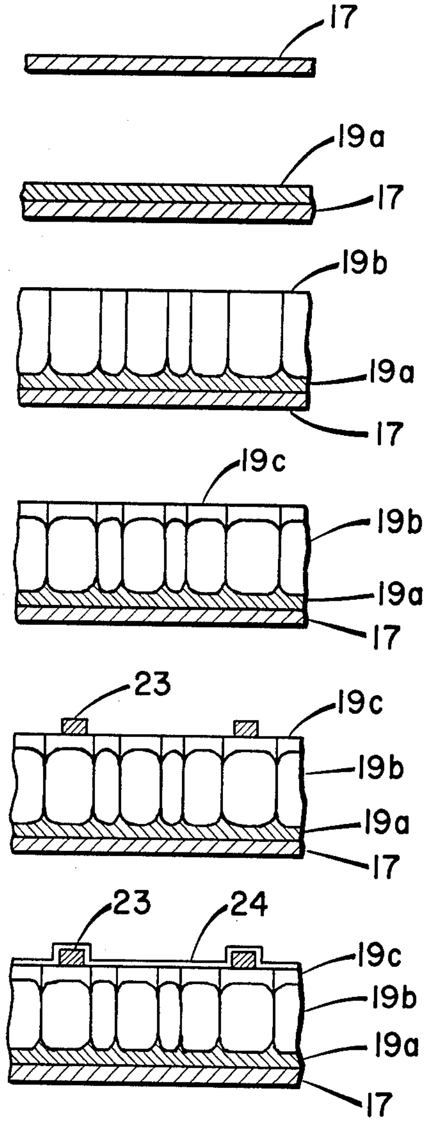
FIG. 4 A–F illustrate the various steps in manufacturing solar cells or other semiconductor devices in accordance with an embodiment of the present invention.

Referring now to FIG. 4 the steps in forming a semiconductor device such as a solar cell rectifier are illustrated in the subfigures 4A–4F. In FIG. 4A there is shown a substrate 17 which may be tantalum of approximately 1 mil thickness with a highly polished upper surface as heretofore described. The initial step in deposition is to form an initial disoriented growth layer 19A which is preferably heavily doped during deposition to provide a contact area on the back side of the device. In a preferred embodiment this is accomplished by the addition of about 40,000 parts per billion by volume of arsine in the hydrogen-trichlorosilane feed stream. Temperatures of the substrate during this period are maintained at a temperature preferably between 900°C. and 1025°C. resulting in an $n^+$ layer of highly amorphous material. Deposition at this lower temperature is preferred for approximately 3–10 minutes duration at which time the temperature is raised to above 1025°C. but below 1200°C. and the dopant level is reduced to provide an n-type silicon of the desired resistivity in connection with the $n^+$ contact layer on the substrate. The higher temperature results in the natural selection of dendritic or columnar silicon monocrystals 19B as may be seen in FIG. 4C having substantially vertical grain boundaries extending away from the substrate and separating the crystals from one another.

Deposition is continued at the higher temperature until the desired thickness of silicon is reached for the particular device being made. In accordance with the preferred embodiment the continuation is for a period of between 25 and 100 minutes resulting in a thickness of between 50 and 500 microns of silicon deposited on the substrate 17.

In order to form p-n junctions as required in the manufacture of semiconductor devices such as solar cells or rectifiers a diffusion of a p-type dopant from the top surface of the crystallites 19B is required and may be carried out by conventional means. It is to be realized, of course, that if the initial deposition of silicon is desired to be p-type instead of n-type, a p-type dopant could be applied during the initial formation of the layer 19A in which case an n-type dopant would be diffused from the top of the crystallites.

In order to provide ohmic contact at the surface of the device the surface layer 19C must be doped to high conductivity of the type opposite that of the layer 19A. In other words where a layer 19A is $n^+$ type the layer 19C should be $p^+$ type resulting in p-n junctions somewhere along the height of the crystallites 19B making each, in effect, a single semiconductor device but all being interconnected by the heavily doped layers 19A and 19C at the opposite surfaces thereof. It is to be noted, however, that the dopants tend to follow the grain boundaries and care must be exercised during diffusion to prevent dopant from the surface conductive layer 19C from coming into contact with the bottom electrode, in effect, shorting out the device. For this reason, when relatively thin films of crystallites 19B are used in manufactured devices it is recommended that an ion implantation system be used for doping. In relatively thicker devices control to prevent shorting is easily achieved and doping can be accomplished by other methods such as incorporation of dopant in the reactor feed stream during deposition of the top surface of the silicon or by diffusion from the top surface after silicon deposition has been completed.

Once the p-n junctions have been achieved the only steps necessary to completion of the device are the application of electrodes for connection with the conductive layers at the opposite surfaces and surface protection of the device. The electrodes 23 may be applied to the device in the desired pattern by conventional techniques such as plating through a mask of either oxide or metal, for example. As shown in FIG. 4F after application of the electrode pattern 23 a surface layer 24 may be applied over the entire device for purposes of protecting the device surface and/or to provide anti-reflective properties or other known properties to the device.

Figure 5:
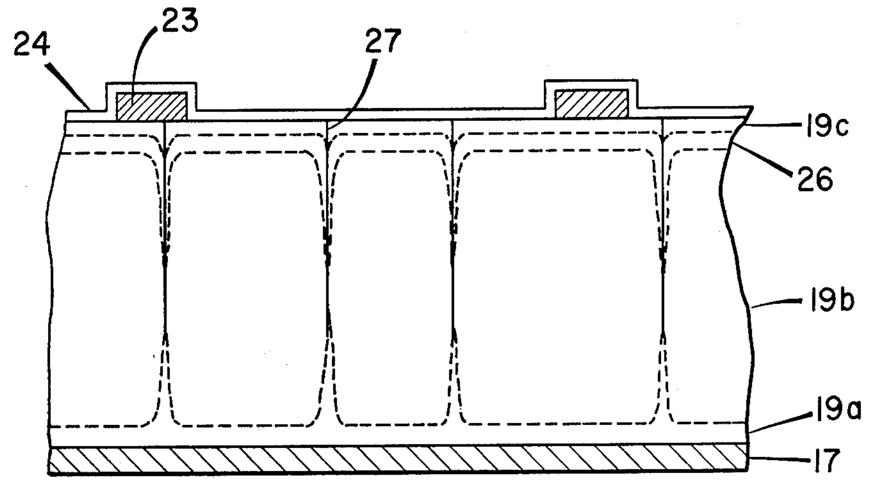
FIG. 5 is a vertical cross-sectional view of a semiconductor device according to the present invention diagrammatically illustrating the various conductivity areas within the material of the device.

FIG. 5 illustrates in greater detail a completed device as made by the process heretofore described with respect to the FIGS. 4A–4F. All elements of FIG. 5 are identical to those described with respect to FIGS. 4A–4F with the exception that the layer 26 which represents the p or n layer forming the junction with the mass 19B of opposite conductivity can be seen in detail and it is to be noted that the shape of the junction follows partway along the grain boundaries 27 which separate the monocrystalline elements from one another. While the grain boundaries 27 are shown in FIG. 5 as extending perhaps 95% of the height of the material, columnar type silicon having grain boundaries which extend at least 50% of the thickness of the silicon sheet are sufficient for manufacture of devices, particularly when relatively thick sheets of silicon are used.

Figure 6:
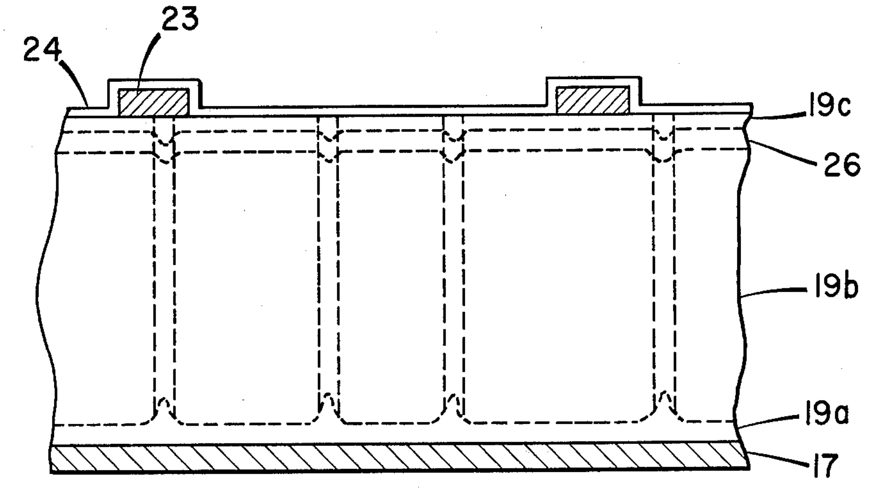
FIG. 6 is a view similar to FIG. 5 in which an alternative embodiment to that of FIG. 5 is illustrated.

While the basic process has been described with respect to FIGS. 1–5 it is to be understood that many variations of the process in light of known prior art techniques are possible. For example, there is shown in FIG. 6 an embodiment which is identical to that shown in FIG. 5 with the exception that the grain boundaries prior to diffusion from the upper surface had been oxidized. The oxidation of the grain boundaries is accomplished by diffusion of oxygen from the surface of the device which again like other dopants tends to follow the grain boundaries rather than travel through the bulk single crystals. The silicon oxide thus formed acts to retard n- or p-type dopants from traveling along the grain boundaries and further assures insulation along them. When such process is used, however, it is necessary to remove the oxide layer which is formed on the surface of the crystallites prior to the addition of dopant to form the junctions and upper contact layer 19C since it is also known that silicon oxides are conventionally used to mask silicon surfaces during doping.

The manufacturer of devices thus far described presumes that the substrate 17 is to remain as a contact area for the finished device. However, it is to be realized that the substrate 17 can be removed as was described in connection with FIGS. 1 and 2 in which case contacts, protective layers, reflective layers, as desired are also applied to the layer 19A in a manner similar to the application of the same to layer 19C. Another variation of the invention is a deposition of a layer on the substrate 17 prior to the start of the silicon deposition on the substrate. This may be used, for example, in applying a gettering layer of a metallic material or an oxide such as phosphorous pentoxide to getter heavy metals from the silicon which is to be deposited. In order to provide for ease in separation it may be desirable in some instances to deposit silicon carbide on the substrate prior to the silicon deposition. For solar cell manufacture it is common to apply an anti-reflection coating on the top surfaces of silicon which is usually a quarter wave length coating having a refractive index approximating 1.8. Silicon oxide, Cerium oxide, and titanium dioxide have been used for this purpose. It is also to be realized that if desired all contacts can be made from one side of the device by etching completely through the device or masking an area and diffusing completely through to provide a highly conductive area within the silicon. The silicon carbide layer would act as a diffusion barrier for anything diffusing out of the substrate which may affect adversely the conductivity of the silicon and manufacturing the desired semiconductor device. Obviously, many other variations and modifications of the present invention will become obvious to those skilled in the art from a reading of the foregoing. It is to be understood that within the scope of the appended claims the invention may be practiced otherwise than as specifically described. The following is a specific example of the present invention.

EXAMPLE 1

A 1 mm. thick tantalum substrate material approximately 3 cm. by 3 cm. square was masked with molybdenum to provide an opening 2 cm. by 2 cm. This was placed on a SPEER SX–4 graphite susceptor plate and heated to a temperature of 900°C. Trichlorosilane in a hydrogen stream in a mol ratio of 2% trichlorosilane was flowed into the reaction chamber in which the susceptor was placed at a rate of 2½ liters per minute for a period of 5 minutes. During this 5 minute period arsine in argon was introduced to the hydrogen-trichlorosilane feed stream in a ratio of 14 parts/million by volume of arsine to argon and 40,000 parts/billion by volume of arsine to the hydrogen-trichlorsilane mixture. After 5 minutes the temperature of the susceptor was raised to 1050°C. and the arsine level was reduced while the same flow rate and mol ratio of trichlorosilane in hydrogen was continued for 95 minutes. The result was a layer of silicon 160 microns thick which adhered firmly to the tantalum substrate. The arsine level during the latter deposition in the three different runs which were otherwise identical was varied with concentrations of 870 parts/billion by volume, 3750 parts/ billion by volume, and 16,000 parts/billion by volume. Microscopic examination of the cross-section of the silicon sheet showed approximately 150 microns of substantially vertical columnar silicon crystallites averaging approximately 10 microns in diameter with substantially no horizontal grain boundaries.

Boron was then diffused into the silicon sheet having the arsine level of 870 parts/billion and diffusion was made from the top thereof to a nominal depth of 0.4 micron. Electrodes were applied by normal solar cell techniques and the solar cell thus produced showed a short circuit current output of 5–10 milliamperes with an open circuit voltage of 100 millivolts. This is equivalent to a solar cell efficiency of 0.2%.

EXAMPLE 2

A silicon sheet was deposited from trichlorosilane in hydrogen stream in a mol ratio of 7% trichlorosilane to hydrogen at a flow rate of one liter per minute on a 3 mm. thick flat graphite substrate heated to 1050°C. until a depth of 4 millimeters of silicon was obtained. Then a 2 centimeters square sample of 370 microns thickness was cut from the center of the sheet by removing surface portions. Crystallite resistivity measured 20–30 ohm-cm n-type (phosphorous doping). Boron was diffused into one surface to a nominal depth of 0.4 micron and electrodes were applied to form a solar cell. Short circuit current was 50 milliamps with an open circuit voltage of 250 millivolts. This is equivalent to a solar cell efficiency of 0.5%.

That which is claimed is:

1. A method of making large area silicon semiconductor devices having p-n junctions, said method comprising:

providing a sheet of silicon of one conductivity type, said sheet having a layer of columnar silicon monocrystals defined by generally vertical grain boundaries extending at least half the thickness of said sheet from one surface thereof, said sheet having an electrically conductive volume in ohmic contact with the other surface of the monocrystalline material defined by said layer;

diffusing a dopant of the opposite conductivity type into said one surface of said sheet in sufficient depth to cause the dopant to diffuse into said surface and along portions of said vertical grain boundaries creating a volume of said opposite conductivity along said surface and along portions of said grain boundaries thereby creating both planar and vertical p-n junctions between diffused and undiffused volumes of said sheet, and applying an electrode pattern interconnecting areas of like conductivity type to form a semiconductor device array by a method which comprises masking the surface of said silicon sheet in a predetermined pattern, and applying metallic conduction material to the open spaces in said mask;

said method of forming said sheet comprising the steps of vapor depositing a layer of polycrystalline silicon on a substrate sheet, converting said polycrystalline silicon to a low electrical resistivity by doping heavily with a dopant of known conductivity type, and then vapor depositing high resistivity semiconductor silicon of said known conductivity type in dense columnar form to form said sheet having vertical grain boundaries.

2. A method as defined in claim 1 wherein said substrate sheet is an electrical insulator.

3. A method as defined in claim 1 wherein said substrate sheet is an electrical conductor.

4. A method as defined in claim 1 wherein said substrate sheet has a surface of silicon carbide provided on portions thereof on which silicon is deposited.

5. A method as defined in claim 1 wherein a metallic or oxide layer is provided on the deposition side of said substrate sheet for gettering heavy impurities.

6. A method as defined in claim 1 wherein said vapor deposition of polycrystalline silicon is accomplished by exposing said substrate to chlorosilane or silane carried in a hydrogen stream while said substrate is heated to a temperature between 900°C. and 1200°C. and continuing said exposure until said deposition reaches a thickness of between 50 and 500 microns.

7. A method as defined in claim 6 wherein trichlorosilane is used and the trichlorosilane to hydrogen ratio in said hydrogen stream is between 0.5 and 10 mole percent and said substrate is subjected to said stream for 3 to 10 minutes at a temperature below 1025°C. and then for an additional 25 to 100 minutes at a temperature above 1025°C.

8. A method as defined in claim 1 wherein said large area silicon semiconductor devices are solar cell arrays.

9. A method of making large area silicon semiconductor devices having p-n junctions, said method comprising:

providing a sheet of silicon of one conductivity type, said sheet having a layer of columnar silicon monocrystals defined by generally vertical grain boundaries extending at least half the thickness of said sheet from one surface thereof, said sheet having an electrically conductive volume in ohmic contact with the other surface of the monocrystalline material defined by said layer;

diffusing a dopant of the opposite conductivity type into said one surface of said sheet in sufficient depth to cause the dopant to diffuse into said surface and along portions of said vertical grain boundaries creating a volume of said opposite conductivity along said surface and along portions of said grain boundaries thereby creating both planar and vertical p-n junctions between diffused and undiffused volumes of said sheet, and applying an electrode pattern interconnecting areas of like conductivity type to form a semiconductor device array, said method of forming said sheet comprising the steps of vapor depositing a layer of polycrystalline silicon on a substrate sheet, converting said polycrystalline silicon to a low electrical resistivity by doping heavily with a dopant of known conductivity type, and then vapor depositing high resistivity semiconductor silicon of said known conductivity type in dense columnar form to form said sheet having vertical grain boundaries.

10. A method as defined in claim 9 wherein said substrate sheet is an electrical insulator.

11. A method as defined in claim 9 wherein said substrate sheet is an electrical conductor.

12. A method as defined in claim 9 wherein said substrate sheet has a surface of silicon carbide provided on portions thereof on which silicon is deposited.

13. A method as defined in claim 9 wherein a metallic or oxide layer is provided on the deposition side of said substrate sheet for gettering heavy impurities.

14. A method as defined in claim 9 wherein said vapor deposition of polycrystalline silicon is accomplished by exposing said substrate to chlorosilane or silane carried by a hydrogen stream while said substrate is heated to a temperature between 900°C. and 1200°C. and continuing said exposure until said deposition reaches a thickness of between 50 and 500 microns.

15. A method as defined in claim 9 wherein trichlorosilane is used and the trichlorosilane to hydrogen ratio in said hydrogen stream is between 0.5 and 10 mole percent and said substrate is subject to said stream for 3 to 10 minutes at a temperature below 1025°C. and then for an additional 25 to 100 minutes at a temperature above 1025°C.

16. A method as defined in claim 9 wherein said large area silicon semiconductor devices are solar cell arrays.

* * * * *

UNITED STATES PATENT AND TRADEMARK OFFICE

CERTIFICATE OF CORRECTION

PATENT NO. : 3,900,943

DATED : August 26, 1975

INVENTOR(S) : Erhard Sirtl; Cedric G. Currin

It is certified that error appears in the above-identified patent and that said Letters Patent are hereby corrected as shown below:

The title reading "Silicon Semiconductor Device Array and Method of Making Same" should read --Method of Making Silicon Semiconductor Device Array-- (Per Amendment).

Column 1, line 12, the word "silicion" should read --silicon--.

Column 2, line 5, the phrase "by 111 grain" should read --by {111} grain--.

Column 3, line 32, the phrase "of siliconcontaining gases" should read --of silicon-containing gases--.

Column 3, line 50, the phrase "is not usual" should read --is not unusual--.

Column 3, line 57, the phrase "111 grain" should read --{111} grain--.

Signed and Sealed this

*Twenty-fifth* Day of *August 1981*

[SEAL]

*Attest:*

GERALD J. MOSSINGHOFF

*Attesting Officer* *Commissioner of Patents and Trademarks*